US011656330B2

(12) United States Patent
Doare et al.

(10) Patent No.: US 11,656,330 B2
(45) Date of Patent: May 23, 2023

(54) BUILT IN SELF TEST TRANSMITTER PHASE CALIBRATION

(71) Applicant: NXP USA, INC., Austin, TX (US)

(72) Inventors: Olivier Vincent Doare, La Salvetat St Gilles (FR); Julien Orlando, Toulouse (FR)

(73) Assignee: NXP USA, Inc., Austin, TX (US)

( * ) Notice: Subject to any disclaimer, the term of this patent is extended or adjusted under 35 U.S.C. 154(b) by 368 days.

(21) Appl. No.: 16/904,200

(22) Filed: Jun. 17, 2020

(65) Prior Publication Data
US 2020/0400783 A1 Dec. 24, 2020

(30) Foreign Application Priority Data

Jun. 21, 2019 (EP) ..................................... 19305808

(51) Int. Cl.
*G01S 7/40* (2006.01)
*G01S 7/28* (2006.01)
*G01S 7/282* (2006.01)
*G01S 7/35* (2006.01)
*H03F 1/32* (2006.01)

(52) U.S. Cl.
CPC ............ *G01S 7/4056* (2013.01); *G01S 7/282* (2013.01); *G01S 7/35* (2013.01); *H03F 1/3247* (2013.01)

(58) Field of Classification Search
CPC .......... G01S 7/4056; G01S 7/282; G01S 7/35; H03F 1/3247
See application file for complete search history.

(56) References Cited

U.S. PATENT DOCUMENTS

| 6,574,286 | B2 | 6/2003 | McVey |
| 8,885,692 | B2 | 11/2014 | Ly-Gagnon |
| 9,923,269 | B1 | 3/2018 | Hageman et al. |
| 2003/0128660 | A1* | 7/2003 | Ito ....................... H04L 27/2675 370/210 |
| 2003/0185327 | A1* | 10/2003 | Chen ........................ H03L 7/18 375/371 |
| 2004/0032913 | A1 | 2/2004 | Dinur |
| 2004/0196925 | A1 | 10/2004 | Moore et al. |
| 2005/0156662 | A1* | 7/2005 | Raghupathy ......... H03G 3/3047 330/10 |

(Continued)

OTHER PUBLICATIONS

U.S. Appl. No. 17/361,590, filed Jun. 29, 2021, entitled "Phase Rotator Calibration Apparatus and Method Therefor".

(Continued)

*Primary Examiner* — Timothy A Brainard
*Assistant Examiner* — Helena H Seraydaryan

(57) ABSTRACT

Disclosed are various embodiments for improving the accuracy of a phase associated with the radar signal by identifying a spectral signature associated with a radio frequency (RF) impairment and performing digital predistortion to enhance the radar performance and to compensate for the impairment that causes offset or imbalance of the phase rotator output cause signal distortion or otherwise degrade of the phase of the signal. The self-calibrating mechanism of the present disclosure is configured to identify the impairments, determine a spectral signature associated with the impairment, and optimize the phase error through digital predistortion of the RF signal based at least in part on the spectral signature associated with the impairment.

17 Claims, 4 Drawing Sheets

(56) References Cited

U.S. PATENT DOCUMENTS

| | | | |
|---|---|---|---|
| 2007/0025433 A1 | 2/2007 | Hammerschmidt et al. | |
| 2007/0058702 A1 | 3/2007 | Zhang | |
| 2008/0192877 A1* | 8/2008 | Eliezer | H03L 7/1806 |
| | | | 375/376 |
| 2010/0041353 A1 | 2/2010 | Alford et al. | |
| 2014/0192923 A1 | 10/2014 | Matsuo et al. | |
| 2017/0288762 A1 | 10/2017 | Miyanaga et al. | |
| 2020/0158821 A1 | 5/2020 | Doare et al. | |

OTHER PUBLICATIONS

U.S. Appl. No. 17/451,828, filed Oct. 22, 2021 and entitled Method, Device, and Radar System.
Kalyoncu, I., "A Phase-Calibration Method for Vector-Sum Phase Shifters Using Self-Generated LUT", IEEE Transactions on Circuits and Systems I: Regular Papers, vol. 66, No. 4, Apr. 1, 2019.
Non-Final Office Action for U.S. Appl. No. 17/361,590, dated Apr. 4, 2022, 20 pages.
Notice of Allowance for U.S. Appl. No. 17/361,590, dated Aug. 23, 2022, 7 pages.

\* cited by examiner

BUILT IN SELF TEST TRANSMITTER PHASE CALIBRATION

CROSS-REFERENCE TO RELATED APPLICATIONS

This application claims the priority under 35 U.S.C. § 119 of European Patent application no. 19305808.8, filed on 21 Jun. 2019, the contents of which are incorporated by reference herein.

BACKGROUND

Field of the Disclosure

The present disclosure relates generally to communication systems and more particularly to radar communication systems.

Description of the Related Art

Frequency-Modulated Continuous Wave radar (FMCW radar) is a type of radar sensor which radiates continuous transmission power similar to continuous wave radar (CW-Radar). However, in contrast to a CW radar system, an FMCW radar system can change operating frequency during measurement: that is, the transmission signal is modulated in frequency (or in phase) during measurement. Improving radar detection is desirable for the next generation FMCW radar systems. For example, wireless communications systems are expected to provide ever increasing data rates which require large transmission bandwidths and high carrier frequencies. However, transceiver architectures that are amenable to high-levels of integration and support the large transmission bandwidths and high carrier frequencies needed for increased data throughput suffer from radio frequency (RF) impairments limiting their performance and hence hindering their wide-spread use in commercial products.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-4 illustrate techniques for improving the accuracy of the phase of a radar signal by calibrating the phase rotator of a radar communication system based at least in part on the spectral signature associated with a radio frequency (RF) impairment. Various embodiments of the present disclosure facilitate the improvement in the accuracy of a phase associated with the radar signal by identifying a spectral signature associated with the RF impairment and performing digital predistortion to compensate for the impairment. In some embodiments, RF impairments such as, for example, gain/amplitude imbalance of the phase rotator, phase imbalance of the phase rotator, leakage of the in-phase (I) mixer of the phase rotator, leakage of the quadrature (Q) of the phase rotator, direct current (DC) offset of the I digital-to-analog converter (DAC), DC offset of the Q DAC, and/or other impairments that cause offset or imbalance of the phase rotator output cause signal distortion or otherwise degrade the phase of the signal. Once the impairments are identified, a correction is applied to reduce the phase error through digital predistortion of the RF signal based at least in part on the spectral signature associated with the impairment.

Improving the accuracy of the transmitter (TX) output phase through predistortion can increase the range of detection of the radar systems. In traditional systems, range detection is improved by using a multi-chip transceiver using beam steering techniques to dynamically adapt the beam pattern of the antennas by changing the signal phase from one channel to another in real time without changing the antenna elements or other hardware. The beam steering performance depends on the accuracy of the phase of each channel antenna. RF and baseband impairments degrade the accuracy of the phase.

Beam steering is intensively used in FMCW radar detection to improve the overall radar performance. Beam steering is implemented to control the direction of the antenna arrays to reinforce the main lobe of radar radiation pattern by controlling the phase and the amplitude of the array antennas of the radar system. Phase and amplitude of the radiation pattern are digitally controlled through a phase rotator. Any distortions from the programmed phase amplitude shall degrade the performance of the radar system. The present disclosure provides a digital solution to quantify the phase distortion and perform digital predistortion based on the frequency domain analysis method to enhance the radar performance. Currently, many radar transmitter systems are targeting 5.625 degrees phase error which corresponds to 6 bits phase control. Various embodiments of the present disclosure target a phase rotator with an error in the range of a 2.81 degrees phase error.

Figure 1:
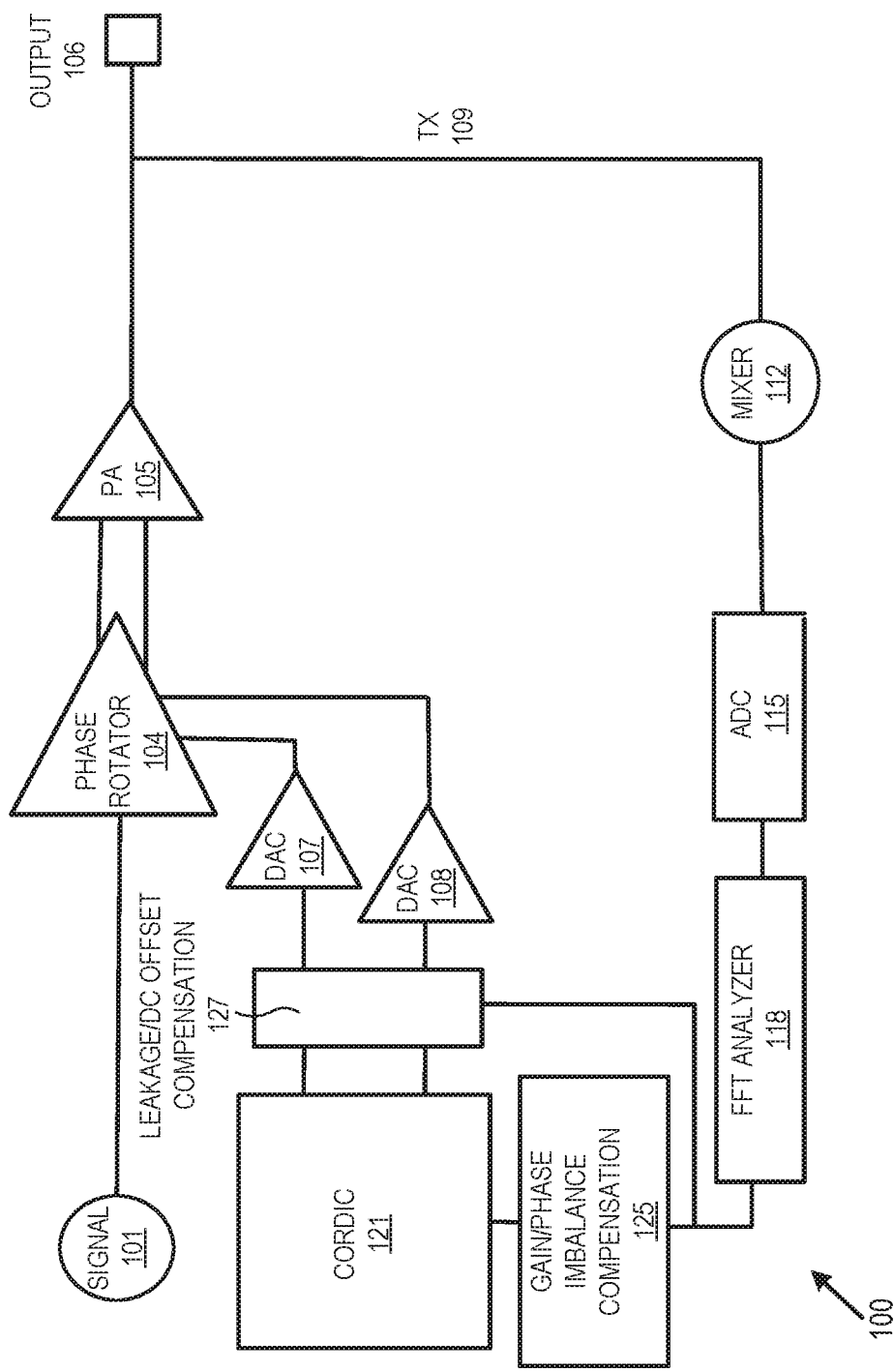
FIG. 1 is a block diagram of an example of a self-calibrating mechanism of a phase rotator of a radar communication system in accordance with some embodiments.

FIG. 1 illustrates an example of a self-calibrating mechanism 100 according to at least one embodiment of the present disclosure. The self-calibrating mechanism 100 may be a part of a transmitter system 109 associated with a transceiver employed by an electronic device. The transmitter system 109 is configured to generate and transmit electromagnetic waves carrying messages or signals, for example, those of radio or television. The self-calibrating mechanism 100 is configured to identify and quantify the RF impairments causing phase error associated with the transmitter system 109 and to apply digital predistortion via a control command associated with the phase rotator to improve the phase accuracy of the transmitted signal, based at least in part on the spectral signature associated with the impairment in order to compensate the corresponding phase error. The phase error is indicative of the quality of the phase component of the modulated signal. For example, a very high phase error between channels might create pointing errors (errors in the directivity of the main lobe) and side lobe in a phased array system. The phase error is associated with the 77 GHz carrier signal 101.

To identify and quantify the impairments, the self-calibrating mechanism 100 associated with the transmitter system 109 includes, a phase rotator 104, a power amplifier 105, two digital-to-analog converters (DAC) 107, 108, a mixer 112, an analog-to-digital converter (ADC) 115, a Fast Fourier Transform Analyzer (FFT) 118, and a CORDIC 121.

Each of these modules are individually configured to perform one or more designated operations as follows. The phase rotator 104 is configured to modify the transmission phase of the input signal 101. To this end, the input signal 101 is shifted in phase at the output based on the configuration of the phase rotator 104. The power amplifier 105 is configured to raise the power of an input signal. The DAC 107 and DAC 108 convert digital data into analog format. The mixer 112 is a device that can modulate or demodulate a signal. The mixer 112 is implemented to down convert the frequency of an electromagnetic signal while preserving every other characteristic such as phase and amplitude) of the initial signal. The ADC 115 converts analog signals into digital signals. Control of the phase (amplitude and frequency) at phase rotator 104 output, then at PA output 106 of a modulating continuous transmission signal is achieved by manipulating the amplitudes of separate I and Q DAC inputs data. The FFT Analyzer 118 is configured to sample the input signal, compute the magnitude of the signal, and display the spectrum of these measured frequency components. The FFT Analyzer 118 may be configured to analyze the spectra of electrical signals, dominant frequency, power, distortion, harmonics, bandwidth, and other spectral components of a signal can be observed that are not easily detectable in time domain waveforms. The CORDIC 121 is a circuit configured to implement an algorithm computing the sine and cosine of a value using only basic arithmetic (addition, subtraction and shifts). In some embodiments, compensation of the gain imbalance and phase imbalance 125 is applied at the input of the CORDIC 121. In some embodiments, compensation of the leakage and de offset 127 is applied at the output of the CORDIC 121.

Together, these modules of the self-calibrating mechanism 100 are configured to identify and quantify the RF impairments causing phase error in a radio frequency of the transmitter system 109 and to apply digital predistortion based at least in part on the spectral signature associated with the identified impairment, to improve the accuracy of the phase. Such impairment parameters include amplitude/gain imbalance of the phase rotator 104, the phase imbalance of the phase rotator 104, the DC offset from the leakage of the phase rotator 104, and the DC offset from the transmitter (TX) 109.

As described further herein, the self-calibrating mechanism 100 is generally configured to operate in two modes: an impairment identification mode wherein the self-calibrating mechanism 100 identifies a spectral signature of an impairment associated with the transmitter system 109, and a compensation mode wherein the self-calibrating mechanism 100 applies predistortion associated with gain imbalance and phase imbalance at the input of the CORDIC 121, and the self-calibrating mechanism 100 applies predistortion associated with the offset and leakage at the output of the CORDIC 121 based on the spectral signature. In the impairment identification mode, an input 101 is applied to the phase rotator 104. Also, the phase rotator 104 is further configured to be controlled by the CORDIC 121 through the DAC 107 and DAC 108. In some embodiments, the DAC 107 corresponds to an in phase (I) DAC. In some embodiments the DAC 108 corresponds to a quadrature (Q) DAC.

In the impairment identification mode, the power amplifier 105 is configured to produce a saturated output. That is, in the impairment identification mode output signal 106 corresponds to a saturated output. The output of the power amplifier 105 is the input to the mixer 112. In some embodiments, output signal 106 from the power amplifier 105 is down mixed using the mixer 112 that is then directly sampled by the ADC 115. The down mixed signal is digitized via the ADC 115. The ADC 115 output is a 1 period signal. In some embodiments, the calibration of multiple transmitters TX 109 can be done simultaneously to reduce calibration time using a dedicated ADC 115 or it can be done successively to minimize area with one shared ADC 115.

The FFT Analyzer 118 performs a Fast Fourier Transform on the signal obtained from the ADC 115. To this end, the ADC 115 digitizes the analog signal and then the FFT Analyzer 118 implements an FFT on the signal and provides an analysis of the spectral content. When performing an FFT on a signal, windowing functions enhance the ability of the FFT to extract spectral data from a signal. However, in some embodiments of the present disclosure, the FFT Analyzer 118 applies the FFT to the signal obtained from the output of the ADC 115 without windowing because the generated IF signal is one (1) exact period and each phase step is at an equal distance. In some embodiments, a 16-point FFT is performed on the generated signal an FFT analyzer 118. To this end, the number of points of the FFT is directly linked to the number of points (sample) used to generate the intermediate frequency (IF) signal. In this exemplary embodiment, 16 points is selected to perform a one period signal. The IF is described by 16 points which corresponds to equal phase steps between each. In other embodiments, the FFT is applied on the generated signal using an 8-point FFT via the FFT Analyzer 118. In at least one embodiment, 8 points are selected to perform a one period signal, and the IF is described by 8 points which corresponds to equal phase steps between each.

As a consequence of performing the FFT on the signal, harmonics can be detected. Harmonics of the spectral signature indicate the magnitude of each of the RF impairments. The spectral signature associated with the leakage RF impairment shows the Harmonics (H2) level variation depending on the phase rotator 104 leakage value. Similarly, the spectral signature associated with the offset of the DAC 107 and DAC 108 shows the H2 level variation. The spectral signature associated with a gain imbalance RF impairment shows the Harmonics 3 (H3) level variation depending on the gain imbalance value. Similarly, the spectral signature associated with the phase imbalance RF impairment shows the H3 level variation depending on the phase imbalance value.

Accordingly, analysis of the harmonics of the spectral signature identifies the magnitude of the parameters which degrade the phase error. As an illustrative example, when the phase rotator 104 has no errors, no harmonics are observed on the spectrum of measured frequency components assuming there is no DC offset in the transmitter system 109. However, when the phase rotator 104 has an RF impairment associated with either gain or phase imbalance, third harmonics are observed on the spectrum of measured frequency component. In addition, when the phase rotator 104 has an RF impairment associated with mixer leakage, second harmonics are observed on the spectrum of the measured frequency component.

The compensation module is configured to compensate for the impairment associated with the spectral signature by reducing the level of the harmonics. A decrease in the level of harmonics corresponds to an increase in the performance of the transmitter 109 by reducing its phase error. Therefore, the optimal predistortion value corresponds to the minimum level of harmonics. In compensation mode, the self-calibrating mechanism 100 is configured to differentiate the spectral signature of the leakage, offset, and the gain and phase imbalance.

In one embodiment, the compensation module 300 applies a control command indicating the digital predistortion added at the output of the CORDIC 121 to compensate for offset and leakage impairments. In other embodiments the compensation module 300 is configured to generate the digital predistortion via the CORDIC 121 to compensate for gain and phase imbalance impairments. In some embodiments, the compensation module 300 applies digital predistortion in the baseband via the control command. It can be appreciated that the self-calibrating mechanism 100 may be applied to all devices using an I/Q modulator and a power amplifier 105. It can be further appreciated that in other embodiments the techniques discussed herein may be applied to any of a variety of devices using I/Q modulators which include a device that produces a saturated output.

Figure 2:
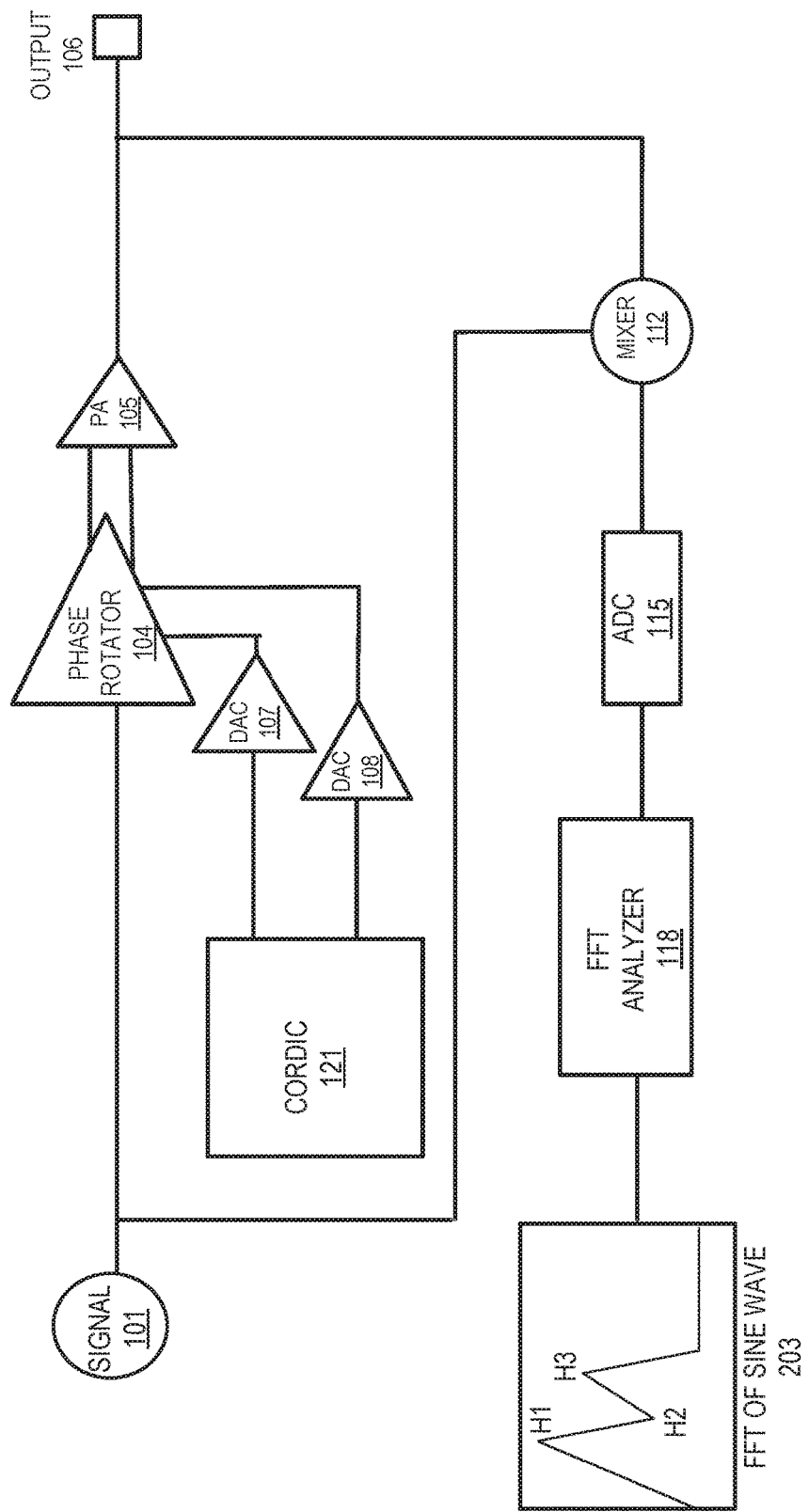
FIG. 2 is a block diagram of an example of an impairment identification module of the self-calibrating mechanism of FIG. 1 in accordance with some embodiments.

FIG. 2 illustrates an example of an impairment identification module 200 of the self-calibrating mechanism 100 of FIG. 1 in accordance with some embodiments. The impairment identification module 200 is configured to identify a type of RF impairment and based at least in part on the RF impairment determine a spectral signature associated with the RF impairment. For example, in some embodiments, phase imbalance of the phase rotator 104, gain imbalance of the phase rotator 104, DC offset, and the leakage of the phase rotator 104 or leakage from other modules of the transmitter 109 (FIG. 1) such as the DAC are corrupting the accuracy of the programmed phase of the transmitter system 109. In some embodiments, a phase error signal 101 corresponds to a 77 GHz RF signal input to the phase rotator 104. Also, the phase rotator 104 is further configured to be controlled by the CORDIC 121 through the I-DAC 107 and Q-DAC 108, The output of the phase rotator 104 is the input to the power amplifier 105 which is a saturation mechanism at the phase rotator 104 output of the phase rotator 104 resulting in a radio frequency signal 106. The saturation properties of the power amplifier 105 combined to the I/Q modulator impairments has a spectral signature. The analysis of the spectral signature through its harmonics level allows the identification of parameters which degrades the phase error.

The radio frequency signal 106 from the power amplifier 105 is down mixed using the mixer 112. The down mixed signal is digitized via the analog-to-digital converter (ADC) 115. Spectral analysis of the 1 period generated signal is performed through a 16 points FFT via the FFT Analyzer 118 which produces an FFT of the sine wave 203. The spectral signature is obtained utilizing the combination of the identified impairment and the saturation of the power amplifier 105. As illustrated, the DC offset and leakage both have a Harmonic 2 (H2) spectral signature. Therefore, the Harmonic 2 is the signature of a DC offset in the transmitter path and the leakage in the phase rotator 104. Harmonic 3 is the spectral signature of the gain of the phase rotator 104 or phase imbalance of the phase rotator 104. Once the spectral signature associated with the impairment is identified, a second mechanism, such as the compensation module 300 (FIG. 3) discussed herein, is implemented in order to compensate for the impairment, thus, improving the accuracy of the signal as discussed herein.

Figure 3:
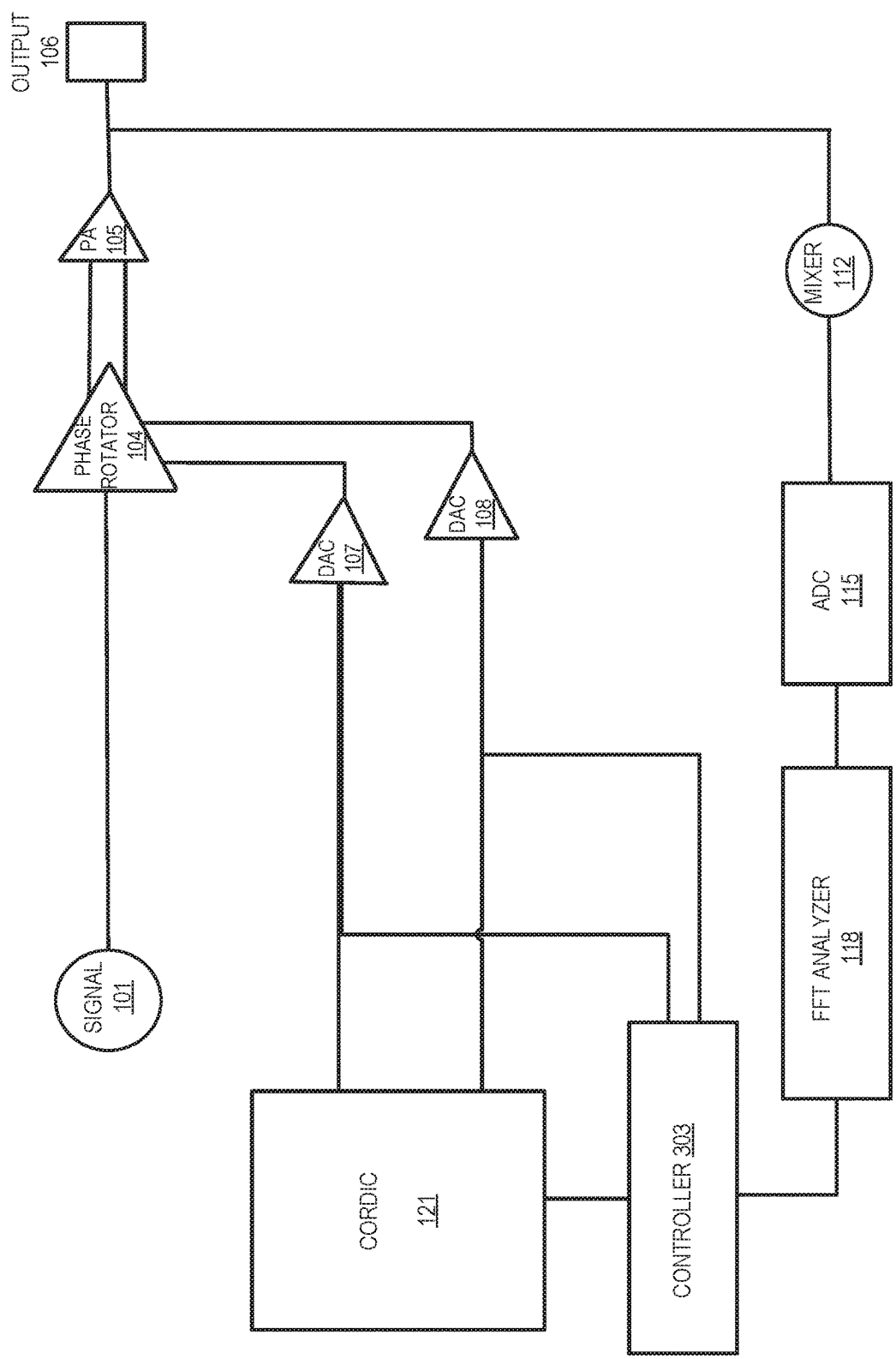
FIG. 3 is a block diagram of an example of a compensation module of the self-calibrating mechanism of FIG. 1 in accordance with some embodiments.

FIG. 3 illustrates an example of a compensation module 300 of the self-calibrating mechanism 100 of FIG. 1 in accordance with some embodiments. The compensation module 300 is configured to calibrate the phase rotator 104 through a controller 303 in order to optimize the phase error. In some embodiments, compensation of the gain imbalance and phase imbalance 125 is applied at the input of the CORDIC 121. In some embodiments, compensation of the leakage and dc offset 127 is applied at the output of the CORDIC 121.

Because the spectral signature associated with the leakage differs from the spectral signature associated with the gain and phase imbalance, the compensation module 300 performs the predistortion in two parts. In some embodiments, the predistortion of the I and Q leakage is performed first, then predistortion of the gain and phase imbalance is performed. When the compensation module 300 applies leakage predistortion, the compensation module 300 is configured to compensate the signal on both the in-phase leakage impairment and the quadrature leakage component. In some embodiments, the compensation module 300 is configured to compensate for the I leakage and the I DC offset. The compensation module 300 then compensates for the Q leakage and the Q DC offset. The compensation module 300 performs compensation for the I leakage and I DC offset a second time. The compensation module 300 then performs compensation for the Q leakage and the Q offset a second time.

Similarly, in some embodiments, when the compensation module 300 applies gain imbalance and phase imbalance predistortion, the compensation module 300 is configured to compensate for the gain imbalance, and then compensate for the phase imbalance. The compensation module 300 is configured to compensate for the gain imbalance a second time. The compensation module 300 is further configured to compensate for the phase imbalance a second time.

Figure 4:
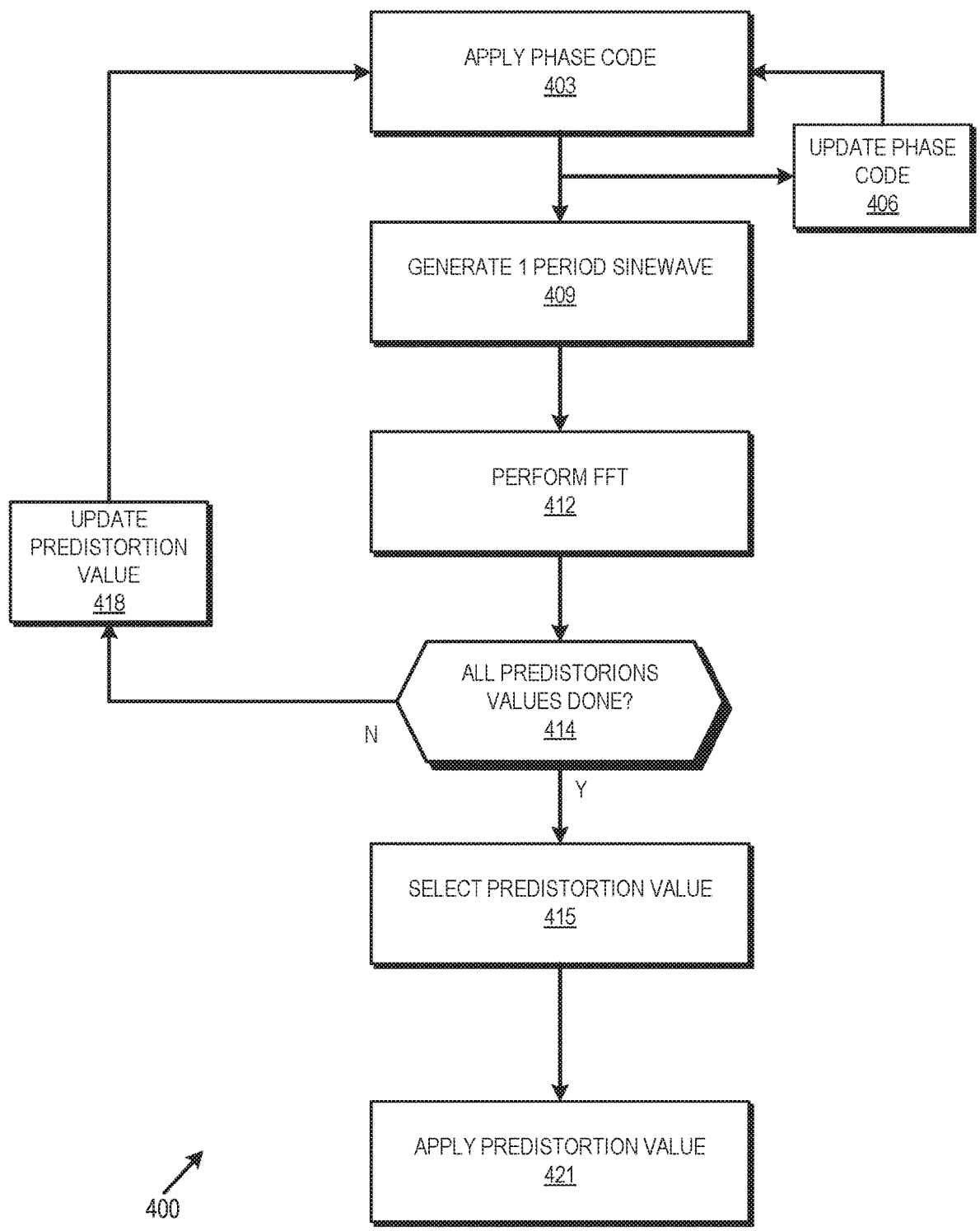
FIG. 4 is a flowchart illustrating an example method for calibrating a phase rotator of a radar communication system employing the self-calibrating mechanism of FIG. 1 in accordance with some embodiments.

Turning now to FIG. 4, shown is a flowchart that provides another example of the operation of the self-calibrating mechanism 100 (FIG. 1) according to at least one embodiment of the present disclosure. It is understood that the flowchart of FIG. 4 provides merely an example of the many different types of functional arrangements that may be employed to implement the operation of the self-calibrating mechanism 100 as described herein. That is, the flowchart sets forth an example of the functionality of the self-calibrating mechanism 100 in the implementation of the identifying of an RF impairment, determination of a spectral signature associated with the impairment, and compensating for the impairment based at least in part on the spectral signature. It is understood that the flow may differ depending on the specific circumstances. Also, it is understood that other flows and actions may be employed other than those discussed herein.

Beginning with block 403, a phase code is applied to the CORDIC 121. At block 406, the self-calibrating mechanism 100 updates the phase code by taking a series of consecutive measurements of the phase 120 is taken from 0 to 360 degrees in 22.5-degree increments, Put another way, the phase 120 is swept from 0 to 360 degrees by 22.5 degrees increments. Each updated phase code in the sweep is applied to the CORDIC 121. The self-calibrating mechanism 100 then moves to block 409 and generates a 1 period sine wave. The self-calibrating mechanism 100 then moves to block 412 and performs an FDR to identify the level of the harmonics of the output of the CORDIC 121. The optimal predistortion value corresponds to the minimum level of harmonics. Accordingly, at block 414 the self-calibrating mechanism 100 determines if all FFTs for all candidate predistortion values have been calculated. If not, at block 418 the self-calibrating mechanism 100 updates the candidate predistortion value, and the method returns to block 403 for another phase code sweep using the updated predistortion value. Once all FFTs for all predistortion values have been selected, the method flow moves to from block 414 to block 515, and the self-calibrating mechanism 100 selects the predistortion value that corresponds to the minimum level of harmonics in the FFTs calculated at block 412. The method flow proceeds to block 421 and the selected predistortion value is applied to reduce the phase error of the RF signal. i Returning to block 418, in some embodiments, in block 418 the self-calibrating mechanism 100 applies predistortion associated with the gain of the phase and also predistortion associated with the leakage at the CORDIC 121 input. However, when there is no predistortion the CORDIC 121 is configured to generate values corresponding to Gain_init*cos(phase_code) for the I path and Gain_init*sin(phase_code) for the Q path such that the I path and the Q path correspond to the input of the DAC 107, 108. In another embodiment, when there is a Gain/amplitude imbalance, predistortion is applied at the input of CORDIC 121 corresponding to Gain_init*GainA*cos(phase_code) for path and Gain_init*gainB*sin(phase_code) for the Q path. In yet another embodiment, when there is a phase imbalance, predistortion is applied at the input of the CORDIC 121 corresponding to Gain_init*cos(phase_code+phase predist_I) for I path and Gain_init*sin(phase_code+phase predist_Q) for Q path. In another embodiment, when there is both phase and gain imbalance, predistortion is combined and applied at the inpur of the CORDIC 121 input corresponding to Gain_init*GainA*cos(phase_code+phase_predist_I) for I path and Gain_init*gainB*sin(phase_code+ phase predist Q) for Q path.

In other embodiments, predistortion associated with leakage or DC offset is applied at the CORDIC output. The updated predistortion value is then applied to the CORDIC 121. The self-calibrating mechanism 100 then moves to block 421 and applies the predistortion value. Each iteration is divided in 2 steps to respectively compensate for the leakage of the phase rotator 104 associated with the in phase and quadrature components. Similarly, for gain and phase predistortion, two iterations are performed. Each iteration is divided in 2 steps to respectively compensate the gain and the phase imbalance.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

The invention claimed is:

1. A method for calibrating a phase rotator, the method comprising:
identifying an impairment associated with a phase error of an RF signal;
determining a spectral signature associated with the impairment; and
in response to determining the spectral signature, compensating for the impairment based on the spectral signature,
wherein the compensating is being performed in a baseband using a cordic algorithm at an input of the cordic algorithm, the cordic algorithm being configured to control a digital-to-analog converter, DAC, which provides an input to the phase rotator.

2. The method of claim 1, wherein the impairment corresponds to a phase imbalance impairment.

3. The method of claim 1, wherein the impairment corresponds to a gain imbalance impairment.

4. The method of claim 1, wherein the compensation is being performed at a cordic output.

5. The method of claim 4, wherein the cordic output corresponds to an input associated with a digital-to-analog converter, DAC.

6. The method of claim 5, wherein the impairment corresponds to an DAC DC offset impairment.

7. The method of claim 5, wherein the impairment corresponds to a mixer-leakage impairment.

8. An apparatus for calibrating a radio frequency, RF, transmitter, the apparatus comprising:
 a radio frequency phase rotator configured to receive an input from a digital-to-analog converter, DAC;
 a power amplifier positioned at an output of the radio frequency phase rotator;
 a mixer configured to down convert an RF signal received from the power amplifier;
 an analog-to-digital-converter, ADC, configured to digitalize a baseband signal based on the output of the mixer;
 an analyzer configured to apply a Fast Fourier Transform (FFT) algorithm to the baseband signal; and
 a digital compensation module configured to perform digital predistortion on the baseband signal,
 wherein the digital compensation module comprises a cordic circuit, the cordic circuit configured to provide an input to the DAC.

9. The apparatus of claim 8, wherein the FFT is being applied without windowing based on a one period generated signal.

10. The apparatus of claim 8, wherein performing the digital predistortion is based on a type of spectral signature.

11. The apparatus of claim 10, wherein the type of spectral signature is being associated with a leakage impairment or a DC offset impairment, wherein the type of spectral signature corresponds to a Harmonic 2, H2, level.

12. The apparatus of claim 10, wherein the type of spectral signature is being associated with a gain imbalance impairment or a phase imbalance impairment, wherein the type of spectral signature corresponds to a Harmonic 3, H3, level.

13. The apparatus of claim 12, wherein the digital compensation module is further configured to perform digital predistortion using a cordic algorithm.

14. A method for calibrating a phase rotator, the method comprising:
 identifying an impairment associated with a phase error of an RF signal;
 determining a spectral signature associated with the impairment; and
 in response to determining the spectral signature, compensating for the impairment based on the spectral signature, the compensating performed in a baseband using a cordic algorithm,
 wherein the compensation is being performed at an input of the cordic algorithm, the cordic algorithm being configured to control a digital-to-analog converter, DAC, which provides an input to the phase rotator.

15. The method of claim 14, wherein the impairment corresponds to a phase imbalance impairment or a gain imbalance impairment.

16. The method of claim 14, wherein the impairment corresponds to with a leakage impairment or a DC offset impairment.

17. A method for calibrating a phase rotator, the method comprising:
 identifying an impairment associated with a phase error of an RF signal;
 determining a spectral signature associated with the impairment; and
 in response to determining the spectral signature, compensating for the impairment based on the spectral signature,
 wherein the compensation is being performed at a cordic output, the cordic output corresponding to an input associated with a digital-to-analog converter, DAC.

* * * * *